United States Patent
Choi

(10) Patent No.: US 7,449,384 B2
(45) Date of Patent: Nov. 11, 2008

(54) METHOD OF MANUFACTURING FLASH MEMORY DEVICE

(75) Inventor: Se Kyoung Choi, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 348 days.

(21) Appl. No.: 11/298,276

(22) Filed: Dec. 8, 2005

(65) Prior Publication Data
US 2006/0154420 A1 Jul. 13, 2006

(30) Foreign Application Priority Data
Jan. 13, 2005 (KR) .................. 10-2005-0003319

(51) Int. Cl.
*H01L 21/225* (2006.01)
(52) U.S. Cl. .................. 438/264; 438/564; 438/593; 438/775; 257/E21.151
(58) Field of Classification Search ........... 257/E21.151
See application file for complete search history.

(56) References Cited

U.S. PATENT DOCUMENTS 6,812,515 B2 * 11/2004 Rabkin et al. ............... 257/315

2003/0232507 A1 * 12/2003 Chen ........................... 438/763
2004/0043638 A1 * 3/2004 Nansei et al. ............... 438/792

FOREIGN PATENT DOCUMENTS

| KR | 10-2003-0001911 A | 1/2003 |
| KR | 10-2003-0043711 A | 6/2003 |
| KR | 10-2003-0053313 A | 6/2003 |

* cited by examiner

*Primary Examiner*—Stephen W Smoot
(74) *Attorney, Agent, or Firm*—Townsend and Townsend and Crew LLP

(57) ABSTRACT

Provided is a method of manufacturing a flash memory device. In accordance with the present invention, an undoped polysilicon layer is formed over a semiconductor substrate where a floating gate and a dielectric layer are formed. By performing N2 plasma process with respect to the undoped polysilicon layer, a heavily doped polysilicon layer is formed to form a control gate. Due to N2 plasma process, a nitrogen layer is formed at the interfaces between the dielectric layer and the undoped polysilicon layer. As a result, during a re-oxidization process, it is possible to prevent a thickness of the dielectric layer from being increased by reducing diffusion speed phosphorous and oxygen. Additionally, phosphorous of the heavily doped polysilicon layer is diffused into the undoped polysilicon layer in a subsequent process, thereby increasing a phosphorous concentration of the undoped polysilicon layer. Accordingly, it is possible to improve a program speed by increasing a doping concentration of the control gate without a variation of coupling ratio.

15 Claims, 2 Drawing Sheets

N₂ PLASMA PROCESS

METHOD OF MANUFACTURING FLASH MEMORY DEVICE

BACKGROUND OF THE INVENTION

The present invention relates to methods of manufacturing flash memory devices, and more particularly to a method of manufacturing a flash memory device capable of improving programming speed by increasing the phosphorous concentration of the polysilicon layer used as the control gate, but not reducing coupling ratio.

In general, a typical flash memory cell is embodied by forming a gate and source/drain. The gate is comprised of a sequentially stacked structure of tunnel oxide, a floating gate, a dielectric layer, and a control gate at predetermined regions over a semiconductor substrate. The source/drain is formed at both sides of the gate on the semiconductor substrate. Such a flash memory cell is programmed or erased by injecting or emitting electrons to the floating gate, thereby generating hot carriers through a lateral surface of the drain. In addition, the program operation is performed by injecting hot carriers into the floating gate through the tunnel oxide. The erase operation is performed by emitting electrons from the floating gate according to a Fowler-Nordheim (F-N) tunneling mechanism by inducing a high electric field between the source and floating gate, or the bulk and floating gate.

In order to perform the program and erase operations of the flash memory cell, it is necessary to apply a high voltage to all gates. However, there are several limits in the flash memory cell in conditions of low voltage. This is because a bias is not directly applied to the floating gate, but applied only to the control gate. In other words, voltage drops across the dielectric layer between the control gate and the floating gate. This voltage drop depends on the thickness and the junction area of the dielectric layer.

A capacitance rate is known as a "coupling ratio". If coupling ratio is "1," this means that a bias applied to the control gate is applied to the floating gate as it is. Consequently, the smaller the coupling ratio is, the higher a bias applied to the control gate to drive flash memory cells needs to be. The coupling ratio of flash memory cells are largely influenced by the thickness of dielectric layers, junction area between dielectric layers and the gates, and phosphorous doping concentration of polysilicon used as control gates.

In cases where phosphorous doping concentration of polysilicon is increased so as to improve programming speed, the thickness of dielectric layers is increased. Accordingly, coupling ratio is reduced, thereby decreasing programming speed. In contrast, if phosphorous doping concentration of polysilicon is decreased, electrons are depleted so that programming speed is reduced due to a variation of the coupling ratio. Therefore, there is a need for a new doping process in polysilicon used as control gates in order to improve programming speed.

BRIEF SUMMARY OF THE INVENTION

An embodiment of the present invention provides a method of manufacturing a flash memory device capable of improving programming speed by increasing the phosphorus concentration of the polysilicon layer used as a control gate, but not reducing the coupling ratio.

According to another embodiment of the present invention, an undoped polysilicon layer is formed over a semiconductor substrate where a floating gate and a dielectric layer are formed. By applying N2 plasma to the undoped polysilicon layer, a heavily doped polysilicon layer is formed. A nitrogen layer is formed at the interfaces between the dielectric layer and the undoped polysilicon layer due to the $N_2$ plasma process. During a re-oxidization process, it is possible to prevent the thickness of the dielectric layer from being increased by reducing diffusion speed, phosphorous, and oxygen. Additionally, phosphorous of the heavily-doped polysilicon layer is diffused into the undoped polysilicon layer in a subsequent process, thereby increasing the phosphorous concentration of the undoped polysilicon layer. Accordingly, it is possible to improve programming speed by increasing the doping concentration of the control gate without a variation of the coupling ratio.

An aspect the present invention is to provide a method of manufacturing a flash memory device. The method comprises forming a tunnel oxide layer, a floating gate, and a dielectric layer at a predetermined region of a semiconductor substrate; forming an undoped polysilicon layer over a resultant structure and then forming a nitrogen layer between the undoped polysilicon layer and the dielectric layer by performing N2 plasma process with respect to the undoped polysilicon layer; forming a heavily-doped polysilicon layer over the resultant structure; and transforming the undoped polysilicon layer into a doped polysilicon layer by diffusing impurities of the heavily-doped polysilicon layer into the undoped polysilicon layer by a subsequent thermal process.

According to some embodiments of the present invention, the dielectric layer is comprised of three layers of oxide, nitride, and oxide, which are sequentially stacked.

According to further embodiments of the present invention, the heavily-doped polysilicon layer is maintained in a phosphorous concentration of $2.0 Eions/cm^2$.

According to still further embodiments of the present invention, the undoped polysilicon layer and the heavily-doped polysilicon layer are formed in the thickness ratio of 1:4 through 1:7.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF THE INVENTION

Figure 1A:
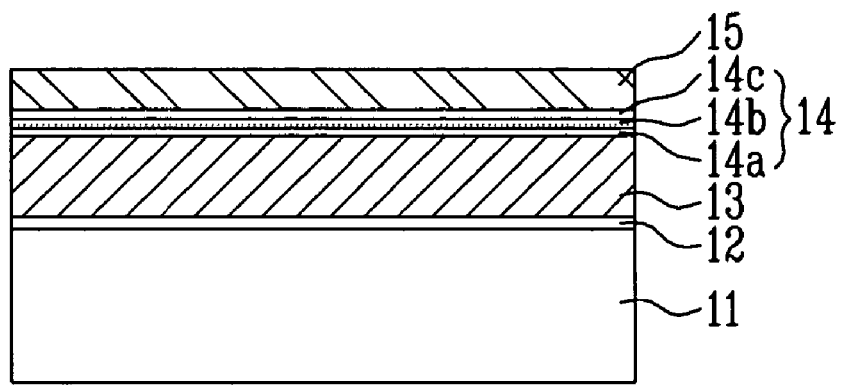
FIGS. 1A-1D are cross-sectional views illustrating a method of manufacturing a flash memory device in accordance with an embodiment of the present invention.

The present invention will be described below in more detail using specific embodiment and the accompanying drawings. The present invention may, however, be embodied in different forms and should not be constructed as limited to the embodiments set forth herein. Like numerals refer to like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Other words used to describe the relationship between elements should be interpreted in like fashion (i.e., "between" versus "directly between," "adjacent" versus "directly adjacent," etc.).

Relative terms such as "below," "above," "upper," "lower," "horizontal," or "vertical" may be used herein to describe a relationship of one element, layer, or region to another element, layer, or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result of, for example, manufacturing techniques and/or tolerances, are to be expected. Thus, embodiments of the invention should not be construed as limited to the particular shapes of regions illustrated herein, but are to include deviations in shapes that result from manufacturing.

The terminology used herein is for the purpose of describing particular embodiments only, and is not intended to limit the invention. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly defined herein.

FIGS. 1A-1D are sequential cross-sectional views illustrating a method of manufacturing a flash memory device in accordance with an embodiment of the present invention.

Referring to FIG. 1A, tunnel oxide 12 and an undoped polysilicon layer 13 are formed over a semiconductor substrate 11, in which a predetermined resultant structure is formed. Then, the undoped polysilicon layer 13 and the tunnel oxide layer 12 are patterned to define a floating gate. A dielectric layer 14 is formed over the doped polysilicon layer 13. The dielectric layer 14 is comprised of a sequentially stacked structure of oxide 14a, nitride 14b, and oxide 14c. An undoped polysilicon layer 15 is formed over the dielectric layer 14. In the event that a doped polysilicon layer is formed over the dielectric layer 14, during a re-oxidization process after an etching process for defining a floating gate, a thickness of the oxide 14c is increased due to phosphorous concentration at the interfaces between the oxide 14c of the dielectric layer 14 and the doped polysilicon layer. By forming the undoped polysilicon layer 15, the phosphorous concentration at the interfaces of the dielectric layer 14 may be reduced so that it is possible to prevent the thickness of the dielectric layer 14 from being reduced.

Figure 1B:
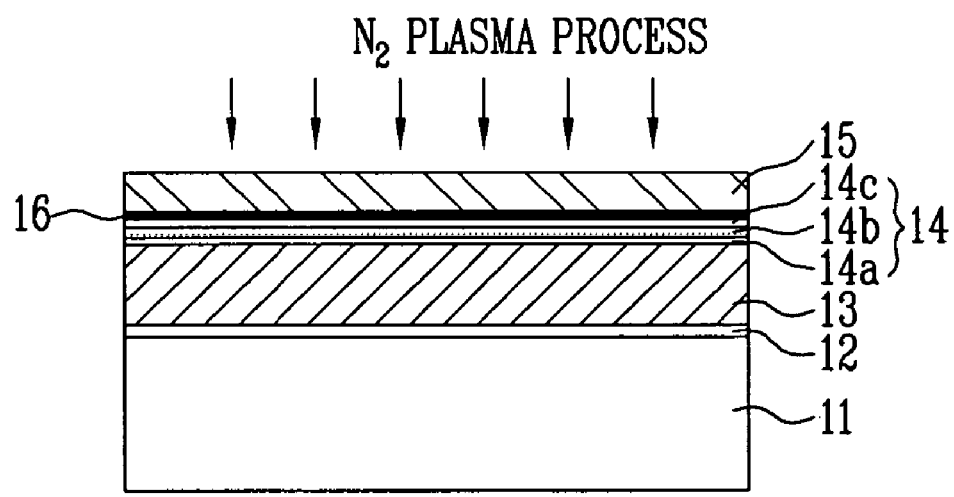

Referring to FIG. 1B, $N_2$ plasma process is performed with respect to the undoped polysilicon layer 15. Due to $N_2$ plasma process, a nitrogen layer 16 is formed at the interfaces between the undoped polysilicon layer 15 and the oxide layer 14c of the dielectric layer 14.

Figure 1C:
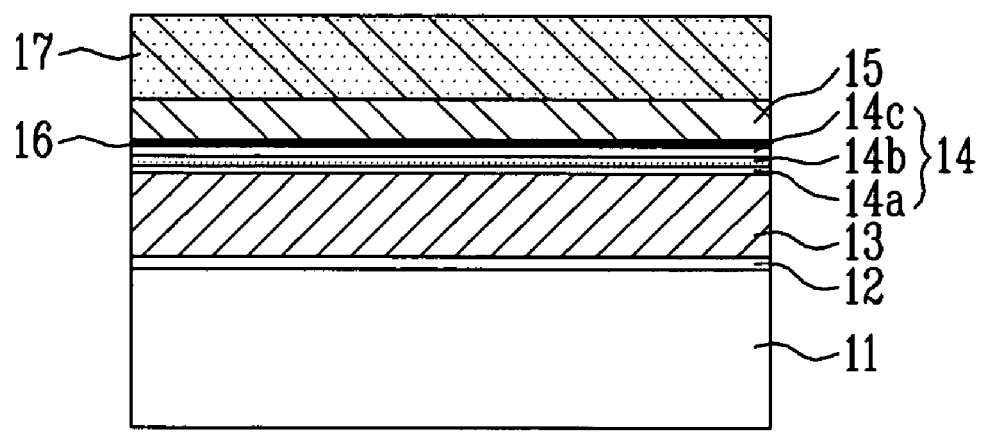

Referring to FIG. 1C, a heavily doped polysilicon layer 17 is formed over a resultant structure. The heavily doped polysilicon layer 17 is maintained in a phosphorous concentration of $2.0E20$ ions/cm$^2$. The ratio of the thickness of the undoped polysilicon layer and the heavily doped polysilicon layer ranges from 1:4 and 1:7.

Figure 1D:
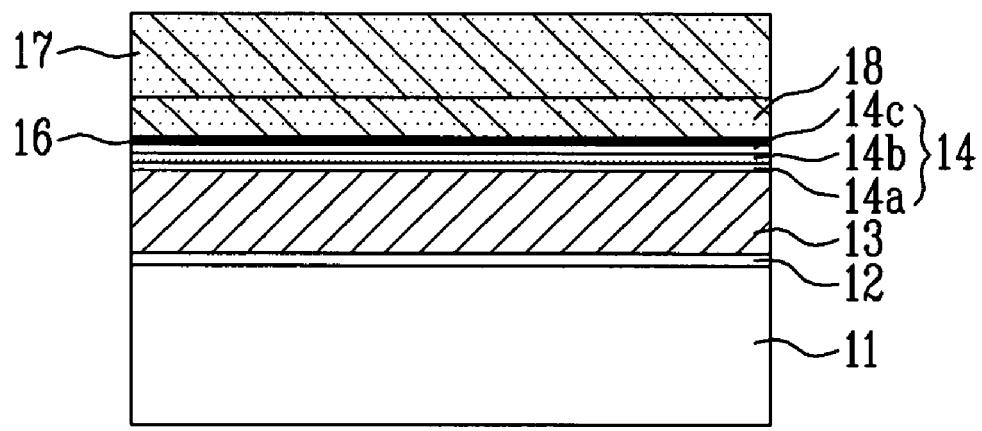

Referring to FIG. 1D, during an annealing process after an ion implantation process to form source/drain or various etching processes, phosphorus of the heavily doped polysilicon layer 17 is diffused into the undoped polysilicon layer 15. As a result, the undoped polysilicon layer 15 is converted to a doped polysilicon layer 18. In this case, the diffusion of phosphorous to the oxide 14c is prevented owing to the nitrogen layer 16 at the interfaces between the undoped polysilicon layer 15 and the oxide 14c of the dielectric layer 14. The nitrogen layer 16 also prevents oxygen from the oxide layer 14c from being diffused into the undoped polysilicon layer 15.

As previously mentioned, an undoped polysilicon layer is formed over a semiconductor substrate where a floating gate and a dielectric layer are formed. After performing an $N_2$ plasma process on the undoped polysilicon layer, a heavily doped polysilicon layer is formed to form a control gate. Due to the $N_2$ plasma process, a nitrogen layer is formed at the interfaces between the dielectric layer and the undoped polysilicon layer. As a result, during a re-oxidization process, it is possible to prevent or control the thickness of the dielectric layer from being increased by reducing the diffusion of phosphorous and oxygen. Additionally, phosphorous of the heavily doped polysilicon layer is diffused into the undoped polysilicon layer in a subsequent process, thereby increasing the phosphorous concentration of the undoped polysilicon layer. Accordingly, it is possible to improve programming speed by increasing the doping concentration of the control gate without the variation of the coupling ratio.

Although the present invention has been described according to an embodiment illustrated in the accompanying drawings, it is not limited thereto. It will be apparent to those skilled in the art that various substitutions, modifications, and changes may be made thereto without departing from the scope of the invention.

What is claimed is:

1. A method of manufacturing a flash memory device comprising:
    forming a tunnel oxide layer, a floating gate layer, and a dielectric layer at a predetermined region of a semiconductor substrate;
    forming an undoped polysilicon layer over the dielectric layer;
    performing a plasma process including nitrogen on the undoped polysilicon layer to form a nitrogen layer at an interface between the dielectric layer and the undoped polysilicon layer;
    forming a doped polysilicon layer over the undoped polysilicon layer; and
    thermally treating the doped polysilicon to convert the undoped polysilicon layer into a doped polysilicon layer by diffusing impurities of the doped polysilicon layer into the undoped polysilicon layer, wherein the nitrogen layer is formed after the undoped polysilicon layer is formed.

2. The method as set forth in claim 1, wherein the dielectric layer is comprised of an oxide layer, a nitride layer, and an oxide layer that are sequentially stacked.

3. The method as set forth in claim 2, wherein the doped polysilicon layer is maintained in a phosphorous concentration of 2.0E20 ions/cm2.

4. The method as set forth in claim 1, wherein the undoped polysilicon layer is formed to have a first thickness and the doped polysilicon layer is formed to have a second thickness, wherein a ratio of the first thickness to the second thickness is within a range of 1:4 to 1:7.

5. A method for manufacturing a flash memory device, comprising:
   forming a floating gate layer over a substrate;
   forming a dielectric layer including a lower oxide layer, a nitride layer and an upper oxide layer over the floating gate layer;
   forming an undoped polysilicon layer over the upper oxide layer of the dielectric layer;
   forming a nitrogen layer over the upper oxide layer of the dielectric layer and below the undoped polysilicon layer, after forming the undoped polysilicon layer;
   forming a doped polysilicon layer over the undoped-polysilicon; and
   thermally treating the doped polysilicon to convert the undoped polysilicon layer into a doped polysilicon layer by diffusing impurities of the doped polysilicon layer into the undoped polysilicon layer.

6. The method of claim 5, wherein the nitrogen layer includes an upper side and a lower side, the undoped polysilicon layer being proximate the upper side of the nitrogen layer, the upper oxide layer of the dielectric layer being proximate the lower side of the nitrogen layer, wherein the nitrogen layer is formed using a plasma process after the undoped polysilicon is formed.

7. The method of claim 6, wherein the nitrogen layer is configured to reduce diffusion of particles from the upper side of the nitrogen layer to the lower side of the nitrogen layer.

8. The method of claim 5, wherein the nitrogen layer is formed using a plasma process in a nitrogen environment.

9. The method of claim 8, wherein the plasma process involves exposing the undoped-polysilicon layer to a plasma generated using nitrogen.

10. The method of claim 9, wherein the converted doped-polysilicon layer and the doped-polysilicon layer define a control gate layer.

11. The method of claim 5, wherein the converted doped-polysilicon layer and the doped-polysilicon layer define a control gate layer.

12. The method as set forth in claim 5, wherein the undoped polysilicon layer is formed to have a first thickness and the doped polysilicon layer is formed to have a second thickness, wherein a ratio of the first thickness to the second thickness is within a range of 1:4 to 1:7.

13. A method of manufacturing a flash memory device, the method comprising:
   forming a tunnel dielectric layer over a substrate, a charge trap layer over the tunnel dielectric layer, and a dielectric layer over the charge trap layer, the dielectric layer having at least three layers stacked together;
   forming an undoped polysilicon layer over the dielectric layer;
   performing a plasma process on the undoped polysilicon layer to form a nitrogen layer at an interface between the dielectric layer and the undoped polysilicon layer, the plasma process exposing nitrogen to the undoped polysilicon layer;
   forming a doped polysilicon layer over the undoped polysilicon layer; and
   thermally treating the doped polysilicon to convert the undoped polysilicon layer into a doped polysilicon layer by diffusing impurities of the doped polysilicon layer into the undoped polysilicon layer.

14. The method of claim 13, wherein the doped polysilicon and the converted doped polysilicon define a gate electrode.

15. The method of claim 13, wherein the nitrogen layer is configured to reduce diffusion of particles from one side of the nitrogen layer to the other side of the nitrogen layer.

* * * * *